(12) United States Patent
Sekiguchi

(10) Patent No.: US 8,072,807 B2
(45) Date of Patent: Dec. 6, 2011

(54) FLOTOX TYPE EEPROM

(75) Inventor: Yushi Sekiguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 263 days.

(21) Appl. No.: 12/594,751

(22) PCT Filed: Apr. 2, 2008

(86) PCT No.: PCT/JP2008/056584
§ 371 (c)(1),
(2), (4) Date: Oct. 5, 2009

(87) PCT Pub. No.: WO2008/123548
PCT Pub. Date: Oct. 16, 2008

(65) Prior Publication Data
US 2010/0149878 A1   Jun. 17, 2010

(30) Foreign Application Priority Data

Apr. 4, 2007   (JP) ................. 2007-098301

(51) Int. Cl.
*G11C 11/34* (2006.01)
(52) U.S. Cl. ............... 365/185.05; 365/182; 365/185.28
(58) Field of Classification Search ............. 365/182, 365/185.05, 185.28
See application file for complete search history.

(56) References Cited

U.S. PATENT DOCUMENTS

| | | | |
|---|---|---|---|
| 5,218,568 A * | 6/1993 | Lin et al. | 365/185.28 |
| 5,267,209 A | 11/1993 | Yoshida | |
| 5,284,786 A * | 2/1994 | Sethi | 438/261 |
| 5,394,002 A * | 2/1995 | Peterson | 257/321 |
| 5,404,037 A * | 4/1995 | Manley | 257/321 |
| 6,878,991 B1 | 4/2005 | Forbes | |
| 7,492,639 B2 * | 2/2009 | La Rosa | 365/185.18 |
| 2005/0136597 A1 | 6/2005 | Shinada et al. | |
| 2007/0018234 A1 | 1/2007 | Chindalore et al. | |
| 2010/0002524 A1 * | 1/2010 | Sekiguchi | 365/185.27 |

FOREIGN PATENT DOCUMENTS

| | | |
|---|---|---|
| JP | 4123471 A | 4/1992 |
| JP | 4364077 A | 12/1992 |
| JP | 9-036335 A | 2/1997 |
| JP | 2005-005731 A | 1/2005 |
| JP | 2005-183763 A | 7/2005 |
| JP | 2007-013197 A | 1/2007 |

* cited by examiner

*Primary Examiner* — Alexander Sofocleous
(74) *Attorney, Agent, or Firm* — Rabin & Berdo, P.C.

(57) ABSTRACT

A FLOTOX EEPROM of the invention includes: a plurality of floating gates 11 arranged in array, each having a tunnel window 12 and allowing electron injection and extraction via the tunnel window; a plurality of select gates 13 provided in one-on-one correspondence to the plural floating gates 11; a control gate 16 shared by the plural floating gates 11; a source 17 shared by the plural floating gates 11; and a drain 18 shared by the plural floating gates 11. Therefore, the FLOTOX EEPROM does not encounter the decrease of junction breakdown voltage of a drain region, allowing the application of sufficiently high write voltage. Further, cell area can be reduced.

12 Claims, 5 Drawing Sheets

FLOTOX TYPE EEPROM

TECHNICAL FIELD

The present invention relates to a FLOTOX EEPROM.

BACKGROUND ARTS

An electrically writable/rewritable EEPROM can find extensive applications because it allows on-board rewrite and rewrite in units of pages or bytes. To be adapted for such extensive applications, the EEPROM is required of high reliability design and further miniaturization.

As a known miniaturizing technique for EEPROM, Patent Document 1, for example, proposes a technique of achieving miniaturization by preventing the degradation of tunnel oxide.

Patent Document 2 proposes a technique of miniaturizing memory cell by forming a microscopic tunnel window.

Further, Patent Document 3 proposes a technique of miniaturizing a floating gate.

Patent Document 1: Japanese Unexamined Patent Application Publication No. 2007-013197
Patent Document 2: Japanese Unexamined Patent Application Publication No. 2005-183763
Patent Document 3: Japanese Unexamined Patent Application Publication No. 2005-005731

DISCLOSURE OF THE INVENTION

Problems to be Solved by the Invention

The EEPROM has been decreased not only in chip size but also in memory cell size, achieving the miniaturization. However, the more miniaturized is the EEPROM, the smaller is a drain area. This makes it difficult to secure a sufficient distance between a drain junction and a channel stopper region so that drain breakdown voltage is lowered to disable the application of a high write voltage.

This problem is described in greater details.

FIG. 4A to FIG. 4D are schematic views for explaining configuration and write operation of a conventional FLOTOX EEPROM. Out of these figures, FIG. 4A and FIG. 4C are plan views of this EEPROM. FIG. 4B is a sectional view taken along the line B-B in FIG. 4A, showing a cross section structure of the EEPROM. FIG. 4D is a sectional view taken along the line D-D in FIG. 4C, showing the cross section structure.

In FIG. 4A to FIG. 4D, floating gates arranged in array are indicated at 1 while tunnel windows associated with the respective floating gates are indicated at 2. Indicated at 3 is a select gate shared by the plural floating gates, and a control gate shared by the plural floating gates is indicated at 4. Indicated at 5 is a source shared by the plural floating gates, while drains provided in one-on-one correspondence to the plural control gates are indicated at 6. These components are formed on a surface layer region of a p-type silicon substrate.

In a write operation of the conventional EEPROM shown in FIG. 4A to FIG. 4D, data is written by collectively injecting electrons into the floating gates 1 in units of bytes, followed by selectively extracting electrons from the cells. Specifically, as shown in FIG. 4A and FIG. 4B, the individual floating gates 1 (Although FIG. 4A shows only three floating gates 1, actual voltage application is collectively controlled on a byte-by-byte basis or in units of eight floating gates) and the shared source 5 are opened, while the ground potential is applied to the plural drains 6 and a voltage Vpp (Vpp represents a write voltage which is a high voltage of 15 to 17V) is applied to the shared control gate 4 and the shared select gate 3. This causes electrons to be injected from each drain 6 to each floating gate 1 via each tunnel window 2 (see FIG. 4B).

On the other hand, when electrons injected into the floating gate 1 are extracted, the ground potential is applied to the shared control gate 4 while the voltage Vpp is selectively applied to the select gate 3 and any drain 6 corresponding to a floating gate 1 which extracts electrons, as shown in FIG. 4C and FIG. 4D. This causes electrons to be extracted from the floating gate 1 corresponding to the drain 6 applied with the voltage Vpp and to flow to the drain 6 via the tunnel window 2 (see FIG. 4D).

More recently, both the chip size and the memory cell size are reduced, as described above. Therefore, the reduced isolation distance requires increasing of field inversion voltage and hence, the channel stopper is increased in impurity concentration. Since the drain area is also reduced, it is difficult to secure a sufficient distance between the drain junction and the channel stopper region. This leads to a problem that the drain breakdown voltage is lowered to disable the application of an adequately high write voltage Vpp.

More specifically, as shown in FIG. 5, the drain region 6 is formed at a region isolated by LOCOS oxides 8 formed in the surface layer region of the p-type silicon substrate 7 by a LOCOS process, for example. A p+ region 9, which is called a channel stopper 9 having high impurity concentration, is formed under the LOCOS oxide 8 so as to increase isolation breakdown voltage. However, there is a problem that unless a given distance 10 is secured between the channel stopper region 9 and the drain (drain junction region) 6, the breakdown voltage of the EEPROM is lowered so that a required voltage for writing data cannot be applied to the drain 6. This makes the EEPROM unable to serve as a memory.

In view of the foregoing, the present invention has a primary object to provide a FLOTOX EEPROM comprising an EEPROM which can be increased in the drain breakdown voltage so as to allow the setting of high write voltage and which is reduced in cell area.

Another object of the invention is to provide a FLOTOX EEPROM which can make a great difference between threshold voltages for electron injection into the floating gate and for electron extraction from the floating gate, achieving the high reliability design.

A still another object of the invention is to provide a FLOTOX EEPROM wherein the drain is shared by the plural floating gates so as to increase the junction breakdown voltage of the drain region.

Yet another object of the invention is to provide a FLOTOX EEPROM wherein erase and write operations are reverse from those of the conventional EEPROM.

Means for Solving the Problems

According to the invention for achieving the above objects, the FLOTOX EEPROM comprises: a plurality of floating gates (11) arranged in array, each having a tunnel window (12) and allowing electron injection and extraction via the tunnel window (12); a plurality of select gates (13) provided in one-on-one correspondence to the plural floating gates (11); a control gate (16) shared by the plural floating gates (11); a source (17) shared by the plural floating gates (11); and a drain (18) shared by the plural floating gates (11).

The alphanumeric characters in parentheses represent corresponding components and the like of an embodiment to be described hereinlater. However, the alphanumeric characters do not mean to limit the scope of the invention. Hereinafter, the same holds for this term.

According to this configuration, the drain (18) is shared by the plural floating gates (11). The drain (18) shared by the plural floating gates (11) can be increased in the area so as to be able to secure a given area as a drain region although the whole body of memory cell is decreased in size. Hence, the drain (18) can attain a high breakdown voltage at its junction. As a result, a great difference can be provided between the threshold voltages for erasure and writing.

Since the select gates (13) are provided in one-on-one correspondence to the floating gates (11), the select gate (13) is made accessible as a bit line (15) by providing a contact at each of the select gates (13).

In such a case, it is preferable to form the contact (14) at a gate on active plane in order to reduce the cell area. It is desirable that each of the plural select gates (13) has a W-polyside structure such as to reduce influence on a substrate.

The FLOTOX EEPROM of the invention may be provided with the plural floating gates (11) and select gates (13) in units of eight pieces.

According to the configuration, electrons can be collectively extracted from the eight floating gates (11) on a byte-by-byte basis. Subsequently, electrons are selectively injected into the floating gates (11) whereby memory write control can be accomplished on a byte-by-byte basis.

The FLOTOX EEPROM of the invention may be configured such that the plural select gates (13) are respectively connected with discrete bit lines (15) and that the drain (18) is connected with a word line (20) shared by the plural floating gates (11).

This configuration can provide a FLOTOX EEPROM featuring write and erase operations reverse from those of the conventional FLOTOX EEPROM.

In accordance with the invention, a method of writing data to the FLOTOX EEPROM according to any one of the above aspects of the invention is characterized in that data is written by collectively extracting electrons from the plural floating gates (11), followed by selectively injecting electrons into the plural floating gates (11).

The method of writing data according to another aspect of the invention is characterized in that electrons are collectively extracted from the plural floating gates (11) by opening the source (17) of the EEPROM, setting the voltage of a substrate (21) to the ground potential, and applying 0V to the control gate (16) and a high voltage to the select gates (13) and the drain (18), and that electrons are injected into the floating gates (11) by opening the source (17) of the EEPROM, setting the voltage of the substrate (21) to the ground potential, applying 0V to the drain (18) and selectively applying a high voltage to the control gate (16) and any select gate (13) corresponding to a floating gate (11) electron injection to which is desired.

These methods of the invention can set a high write voltage and can make a great difference between the threshold voltages for erasing data from or writing data to the EEPROM.

The above and other objects, features and effects of the present invention will become apparent from the following description of the embodiment thereof made with reference to the accompanying drawings.

DESCRIPTION OF REFERENCE NUMERALS

11: Floating gate
12: Tunnel window
13: Select gate
14: Contact
15: Bit line
16: Control gate
17: Source
18: Drain
19: Contact
20: Word line

BEST MODE FOR CARRYING OUT THE INVENTION

An embodiment of the invention will be described in detail as below with reference to the accompanying drawings.

Figure 1A:
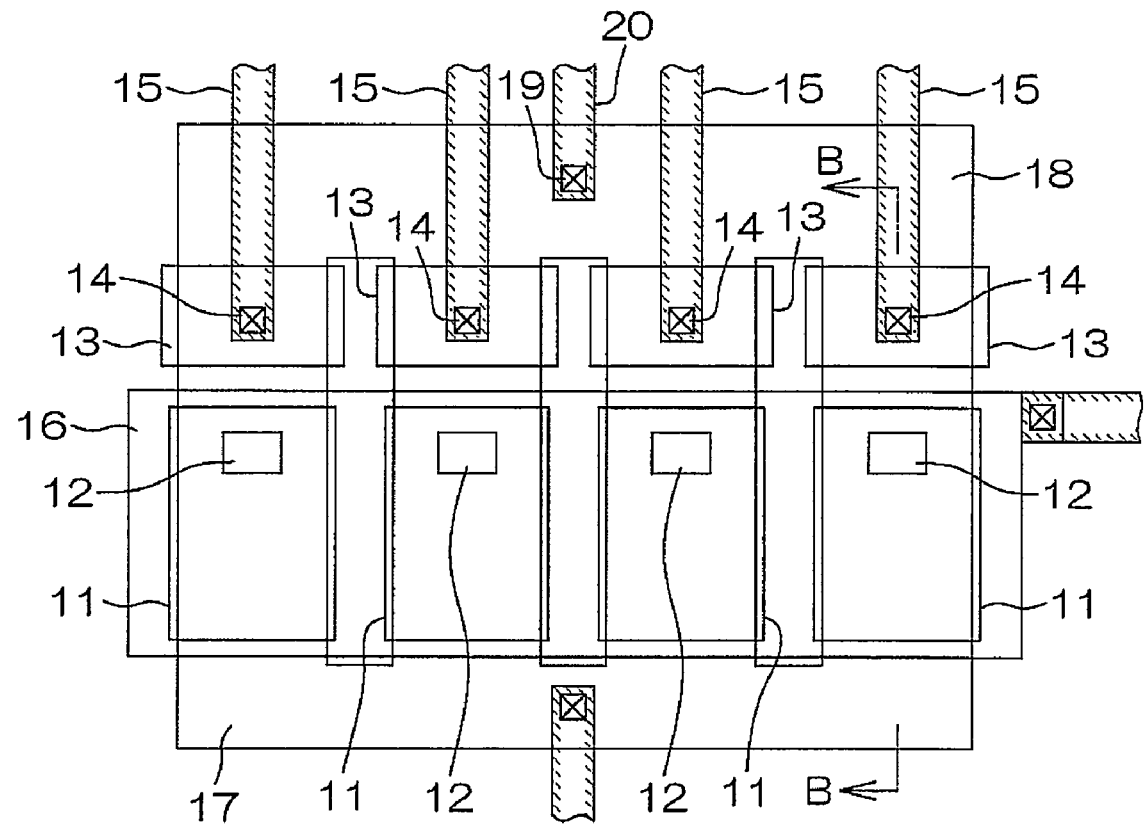
FIG. 1A A schematic plan view for explaining a configuration of a FLOTOX EEPROM according to an embodiment of the invention.
Figure 1B:
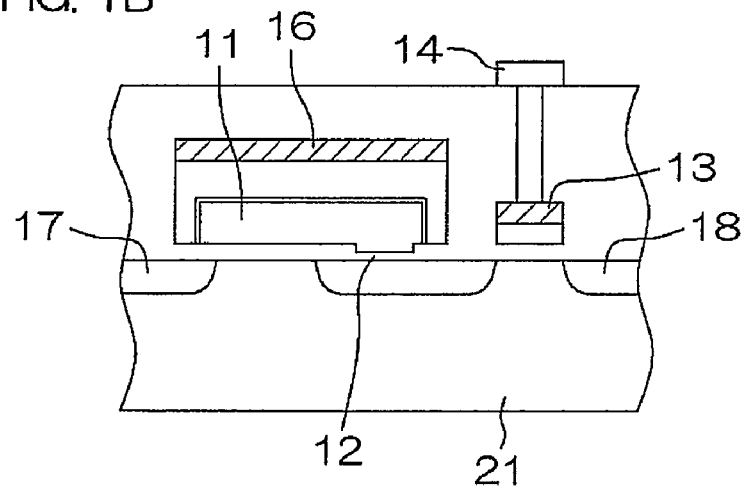
FIG. 1B A schematic sectional view for explaining the configuration of the FLOTOX EEPROM according to the embodiment of the invention.

FIG. 1A is a schematic plan view for explaining a configuration of a FLOTOX EEPROM according to an embodiment of the invention. FIG. 1B is a schematic sectional view taken along the line B-B in FIG. 1A, showing a cross section structure of the FLOTOX EEPROM.

In FIG. 1A and FIG. 1B, indicated at 11 are floating gates arranged in array. While FIG. 1A shows four floating gates arranged in a transverse direction, the floating gates 11 are actually arranged on a byte-by-byte basis. Namely, the floating gates are arranged in units of eight pieces. Indicated at 12 are tunnel windows provided in association with the respective floating gates. Indicated at 13 are select gates provided in correspondence to the respective floating gates 11. Each of the select gates 13 is connected with a discrete bit line 15 via a contact 14. Indicated at 16 is a control gate shared by the plural (normally eight) floating gates 11, while a source shared by the plural (normally eight) floating gates 11 is indicated at 17. A drain shared by the plural (normally eight) floating gates 11 is indicated at 18. As shown in the figure, the drain is shared thereby securing a comparatively large drain region 18. The drain 18 is connected with a word line 20 via a contact 19.

Each of the select gates 13 provided in correspondence to each floating gate 11 has the contact 14 formed at a gate on active plane. In order to reduce influence on a substrate, the select gate 13 and the control gate 16 adopt a W-polyside structure as shown in FIG. 1B.

Figure 2A:
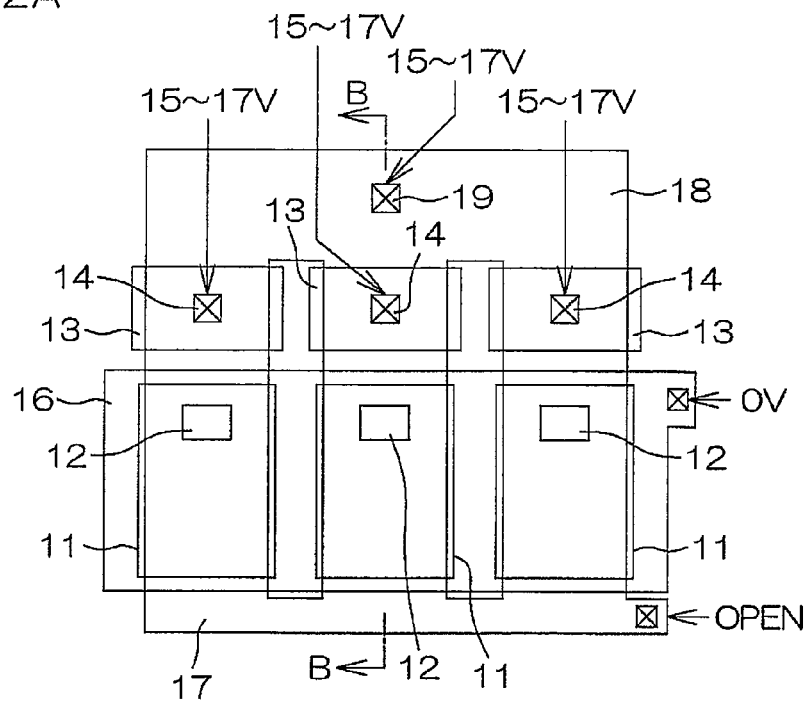
FIG. 2A A view for explaining an operation of the FLOTOX EEPROM according to the embodiment of the invention, showing a manner of applying voltage to erase data.
Figure 2B:
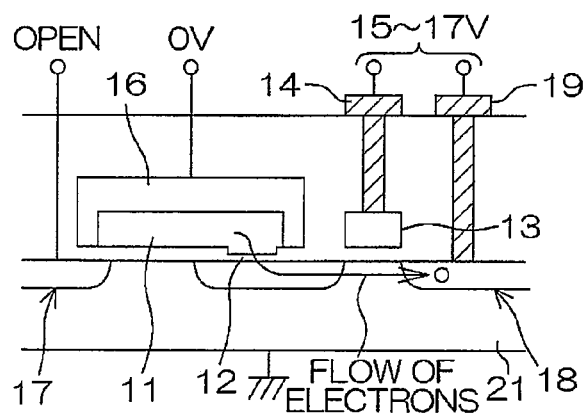
FIG. 2B A view for explaining the operation of the FLOTOX EEPROM according to the embodiment of the invention, showing the manner of applying voltage to erase data.
Figure 2C:
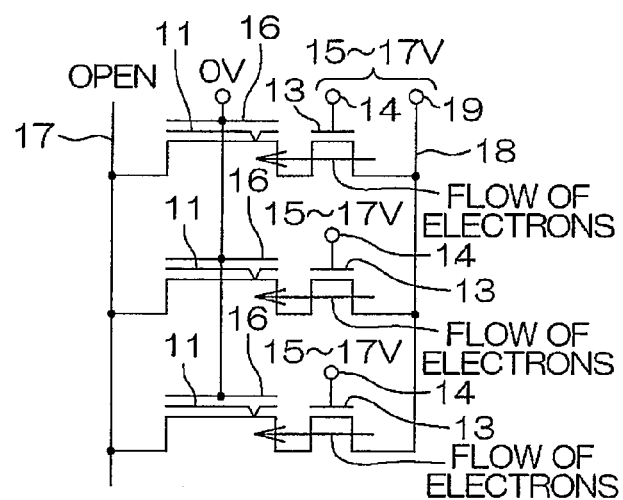
FIG. 2C A view for explaining the operation of the FLOTOX EEPROM according to the embodiment of the invention, showing the manner of applying voltage to erase data.
Figure 3A:
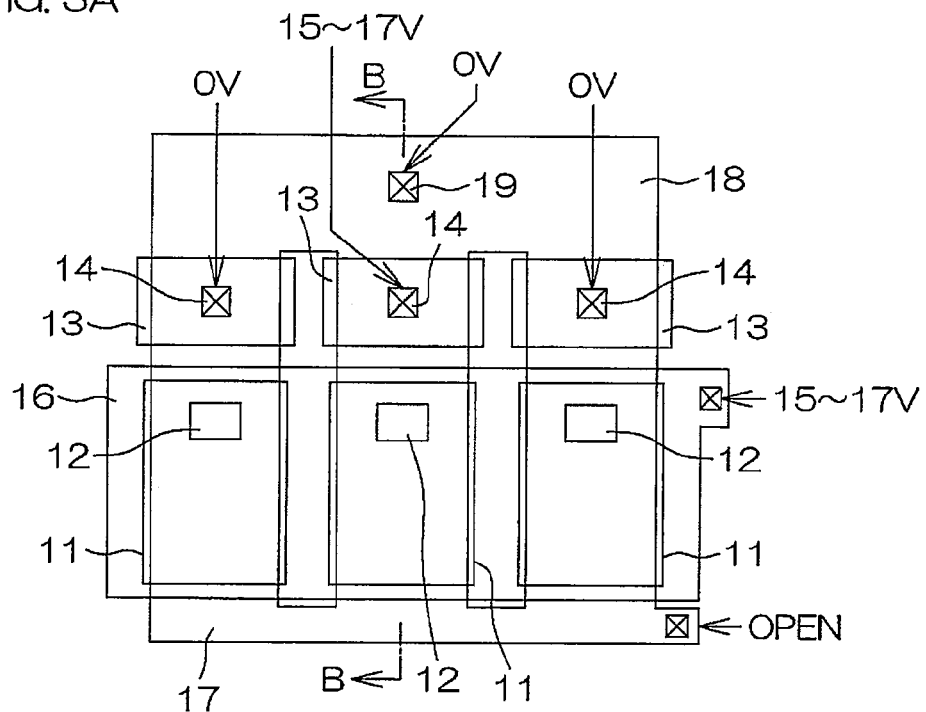
FIG. 3A A view for explaining an operation of the FLOTOX EEPROM according to the embodiment of the invention, showing a manner of applying voltage to write data.
Figure 3B:
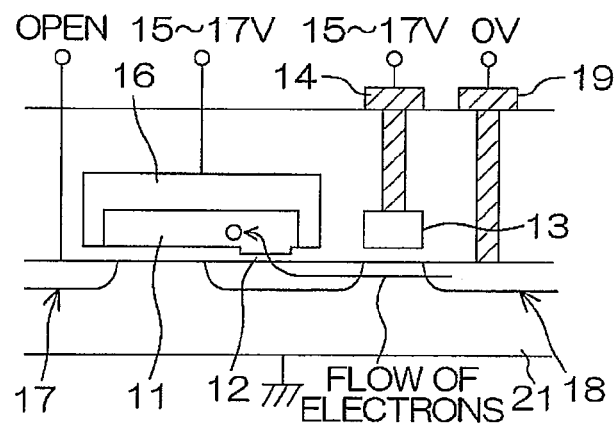
FIG. 3B A view for explaining the operation of the FLOTOX EEPROM according to the embodiment of the invention, showing the manner of applying voltage to write data.
Figure 3C:
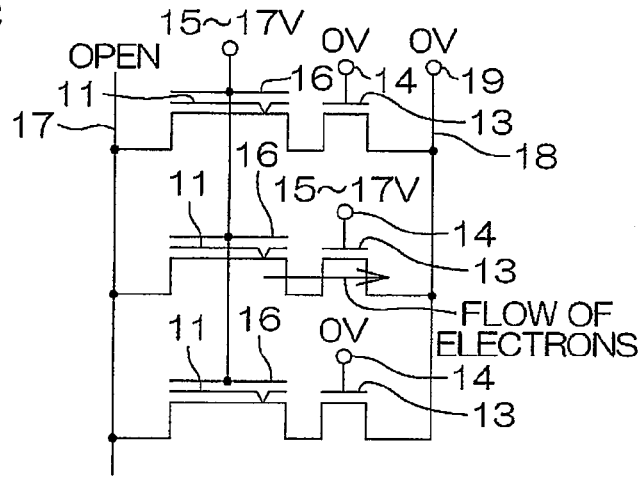
FIG. 3C A view for explaining the operation of the FLOTOX EEPROM according to the embodiment of the invention, showing the manner of applying voltage to write data.
Figure 4A:
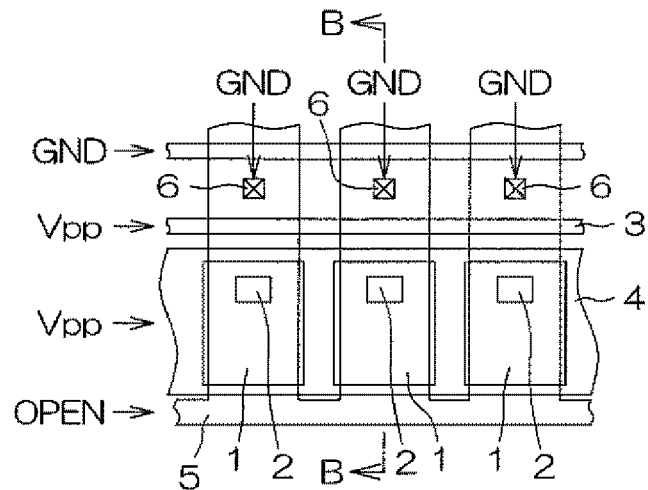
FIG. 4A A schematic view for explaining configuration and write operation of a conventional FLOTOX EEPROM.
Figure 4B:
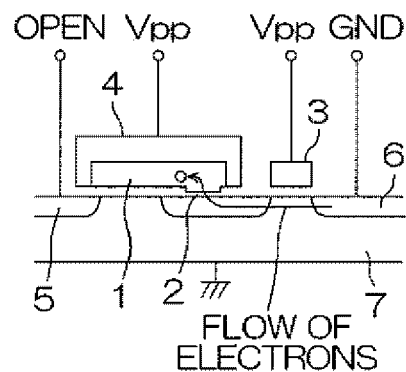
FIG. 4B A schematic view for explaining the configuration and write operation of the conventional FLOTOX EEPROM.
Figure 4C:
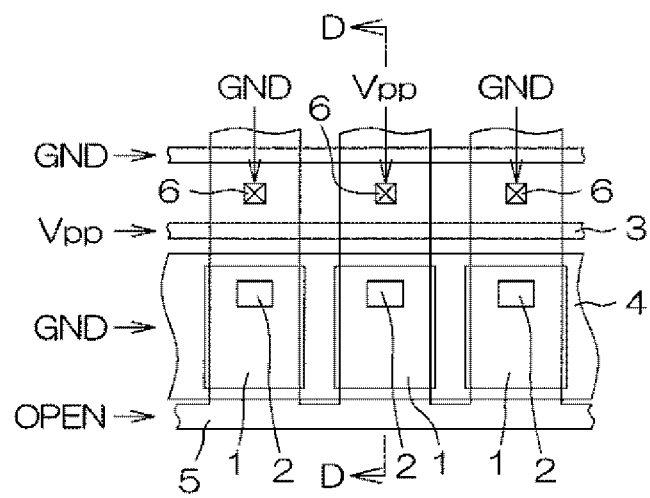
FIG. 4C A schematic view for explaining the configuration and write operation of the conventional FLOTOX EEPROM.
Figure 4D:
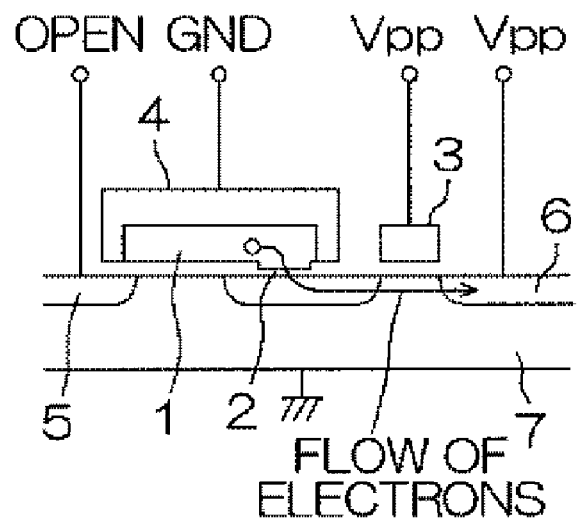
FIG. 4D A schematic view for explaining the configuration and write operation of the conventional FLOTOX EEPROM.
Figure 5:
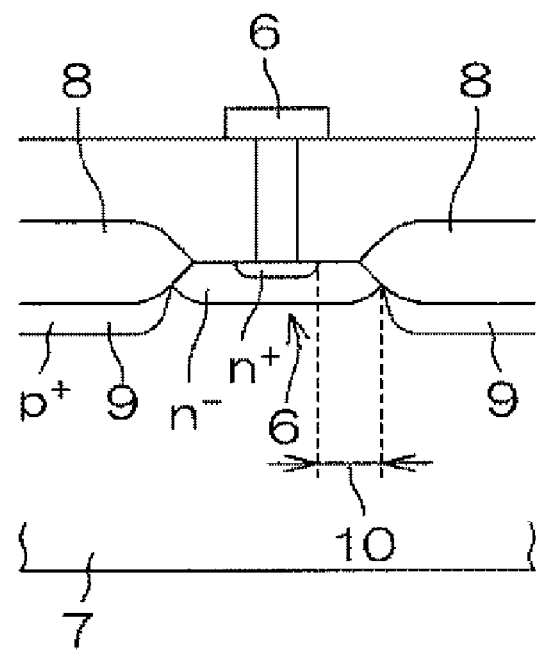
FIG. 5 A sectional view for explaining a distance required for drain breakdown voltage of the conventional FLOTOX EEPROM.

FIG. 2A to FIG. 2C and FIG. 3A to FIG. 3C are views for explaining an operation of the FLOTOX EEPROM according to the embodiment of the invention. FIG. 2A to FIG. 2C show a manner of applying voltage to erase data while FIG. 3A to FIG. 3C show a manner of applying voltage to write data.

FIG. 2A is a plan view of the EEPROM. FIG. 2B is a sectional view taken along the line B-B in FIG. 2A. FIG. 2C is a schematic view showing circuitry of FIG. 2A. Although FIG. 2A to FIG. 2C show a 3-cell configuration (configuration including three floating gates 11), the application of voltage to the floating gates 11 is actually controlled on a byte-by-byte basis, namely in units of eight pieces.

In data erasure, the source 17 is opened, the voltage of a substrate 21 is set to the ground potential, 0V is applied to the control gate 16 and a high voltage of 15 to 17V is applied to the individual select gates 13 and the shared drain 18. This causes electrons to be extracted from the individual floating gates 11 to the drain 18. This voltage application operation is collectively performed on all the cells (floating gates 11) in units of bytes. Namely, the process of extracting electrons from the plural floating gates is collectively performed on a byte-by-byte basis.

Next, a data write operation is described with reference to FIG. 3A to FIG. 3C. FIG. 3A is a plan view of the EEPROM. FIG. 3B is a sectional view taken along the line B-B in FIG. 3A. FIG. 3C is a schematic view showing circuitry of FIG. 3A.

The source 17 is opened while the substrate 21 is set to the ground potential. Then, 0V is applied to the shared drain 18, while a high voltage of 15 to 17V is applied to the shared control gate 16. Further, a high voltage of 15 to 17V is applied only to a select gate 13 corresponding to a floating gate 11 the write operation to which is desired, while 0V is applied to a select gate 13 corresponding to a floating gate 11 which does not require the write operation. Thus, electrons are injected only into the floating gate 11 corresponding to the select gate 13 applied with the high voltage, so as to accomplish the write operation. In this manner, the EEPROM according to the embodiment allows electrons to be injected only into the desired floating gate by controlling the voltage application to the select gates 13 provided in correspondence to the floating gates 11.

When written data is read from the EEPROM with data written to it, a voltage of about 1V, for example, is applied to the control gate 16 and a sense voltage of about 3 to 5V is applied to the individual select gates 13 and the shared drain 18 whereby electric current is not passed through the floating gate 11 injected with electrons but is passed through the floating gate 11 free from injection of electrons. Thus, the data can be read out.

The invention is not limited to the teachings of the embodiment described above, and various changes or modifications may be made thereto within the scope of the claims thereof.

For instance, the above embodiment illustrates the voltage application to the cells (floating gates 11) which is controlled in units of eight pieces but not limited to this. The voltage application may be controlled, for example, in units of four floating gates or of two floating gates. Alternatively, the voltage application may be controlled in units of 16 floating gates.

The present application is based on Japanese Patent Application No. 2007-098301 filed with Japanese Patent Office on Apr. 4, 2007, and the whole disclosure thereof is incorporated herein by reference.

The invention claimed is:

1. A FLOTOX EEPROM comprising:
   a plurality of floating gates arranged in array, each having a tunnel window and allowing electron injection and extraction via the tunnel window;
   a plurality of select gates provided in one-on-one correspondence to the plural floating gates;
   a control gate shared by the plural floating gates;
   a source shared by the plural floating gates; and
   a drain shared by the plural floating gates.

2. The FLOTOX EEPROM according to claim 1, wherein the plural floating gates and select gates are provided in units of eight pieces.

3. The FLOTOX EEPROM according to claim 2, wherein the plural select gates are respectively connected with discrete bit lines, and
   the drain is connected with a word line shared by the plural floating gates.

4. A method of writing data to the FLOTOX EEPROM according to claim 3, wherein data is written by collectively extracting electrons from the plural floating gates, followed by selectively injecting electrons into the plural floating gates.

5. The method of writing data according to claim 4, wherein electrons are collectively extracted from the plural floating gates by opening the source of the EEPROM, setting the voltage of a substrate to the ground potential, and applying 0V to the control gate and a high voltage to the select gates and the drain, and
   electrons are injected into the floating gates by opening the source of the EEPROM, setting the voltage of the substrate to the ground potential, applying 0V to the drain and selectively applying a high voltage to the control gate and any select gate corresponding to a floating gate electron injection to which is desired.

6. A method of writing data to the FLOTOX EEPROM according to claim 2, wherein data is written by collectively extracting electrons from the plural floating gates, followed by selectively injecting electrons into the plural floating gates.

7. The method of writing data according to claim 6, wherein electrons are collectively extracted from the plural floating gates by opening the source of the EEPROM, setting the voltage of a substrate to the ground potential, and applying 0V to the control gate and a high voltage to the select gates and the drain, and
   electrons are injected into the floating gates by opening the source of the EEPROM, setting the voltage of the substrate to the ground potential, applying 0V to the drain and selectively applying a high voltage to the control gate and any select gate corresponding to a floating gate electron injection to which is desired.

8. The FLOTOX EEPROM according to claim 1, wherein the plural select gates are respectively connected with discrete bit lines, and
   the drain is connected with a word line shared by the plural floating gates.

9. A method of writing data to the FLOTOX EEPROM according to claim 8, wherein data is written by collectively extracting electrons from the plural floating gates, followed by selectively injecting electrons into the plural floating gates.

10. The method of writing data according to claim 9, wherein electrons are collectively extracted from the plural floating gates by opening the source of the EEPROM, setting the voltage of a substrate to the ground potential, and applying 0V to the control gate and a high voltage to the select gates and the drain, and electrons are injected into the floating gates by opening the source of the EEPROM, setting the voltage of the substrate to the ground potential, applying 0V to the drain and selectively applying a high voltage to the control gate and any select gate corresponding to a floating gate electron injection to which is desired.

11. A method of writing data to the FLOTOX EEPROM according to claim 1, wherein data is written by collectively extracting electrons from the plural floating gates, followed by selectively injecting electrons into the plural floating gates.

12. The method of writing data according to claim 11, wherein electrons are collectively extracted from the plural floating gates by opening the source of the EEPROM, setting the voltage of a substrate to the ground potential, and applying 0V to the control gate and a high voltage to the select gates and the drain, and electrons are injected into the floating gates by opening the source of the EEPROM, setting the voltage of the substrate to the ground potential, applying 0V to the drain and selectively applying a high voltage to the control gate and any select gate corresponding to a floating gate electron injection to which is desired.

\* \* \* \* \*